United States Patent [19]

Rink

[11] Patent Number: 5,382,785

[45] Date of Patent: Jan. 17, 1995

[54] LASER BEAM DELIVERY PATH AND TARGET PROXIMITY SENSOR

[75] Inventor: John L. Rink, San Francisco, Calif.

[73] Assignee: Diolase Corporation, Berkeley, Calif.

[21] Appl. No.: 153,310

[22] Filed: Nov. 15, 1993

Related U.S. Application Data

[63] Continuation-in-part of Ser. No. 877,746, May 4, 1992, Pat. No. 5,262,636.

[51] Int. Cl.$^6$ .............................................. G01J 1/32
[52] U.S. Cl. .................................... 250/205; 606/12; 250/561
[58] Field of Search ........... 250/561, 221, 205, 214 A; 606/12; 219/121.62

[56] References Cited

U.S. PATENT DOCUMENTS

| | | | |
|---|---|---|---|
| 4,692,924 | 9/1987 | Koizumi et al. | 606/12 |
| 5,200,604 | 4/1993 | Rudko et al. | 219/121.62 |
| 5,285,058 | 2/1994 | Goodwin | 250/205 |

*Primary Examiner*—David C. Nelms
*Assistant Examiner*—Stephone B. Allen
*Attorney, Agent, or Firm*—Howard Cohen

[57] ABSTRACT

A laser diode operating system utilizes the photodiode mounted in the housing of the laser diode, and monitors the photodiode signal to check for a clear laser beam delivery path and a target proximate to the output of the beam path. Upon initial power-up of the system, a brief laser pulse is emitted, and laser light reflected retrograde in the delivery path is received by the photodiode. If the photodiode signal exceeds a first threshold level, due to occlusion of the delivery path, further operation of the system is prevented until the delivery path is cleared. During operator use, the photodiode signal is compared with a second threshold level, and operation is interrupted if the signal fails to exceed the second threshold level. During interruption of operation mode, the laser diode is pulsed briefly and reiteratively to ascertain if a target object is proximate to the laser diode output. If the reflected light level indicates that a target object is proximate, the system will restore continuous operating mode while continuing to monitor the photodiode current.

9 Claims, 3 Drawing Sheets

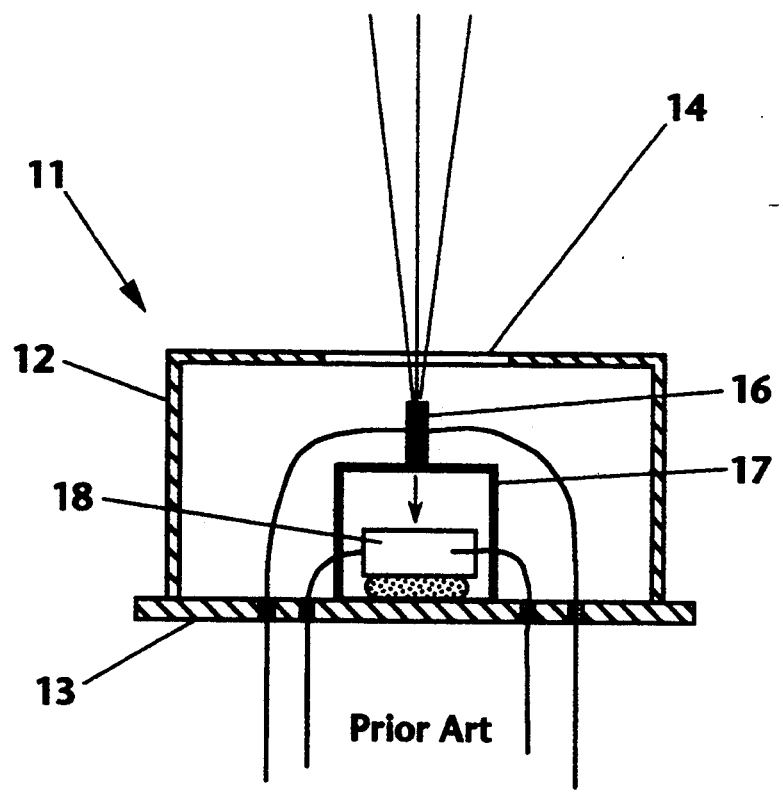
Figure_1
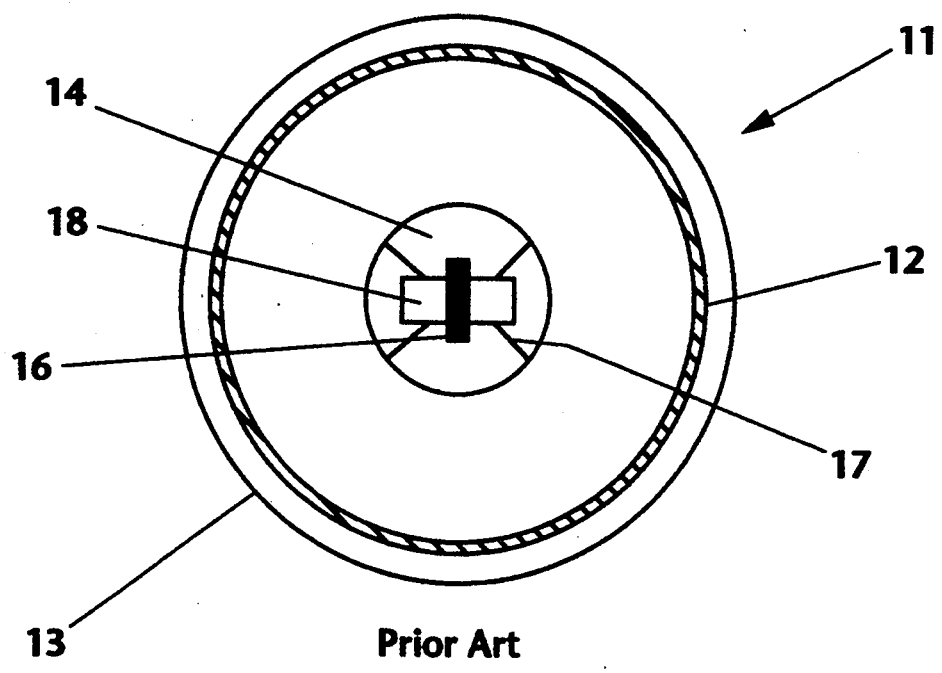
Figure_2

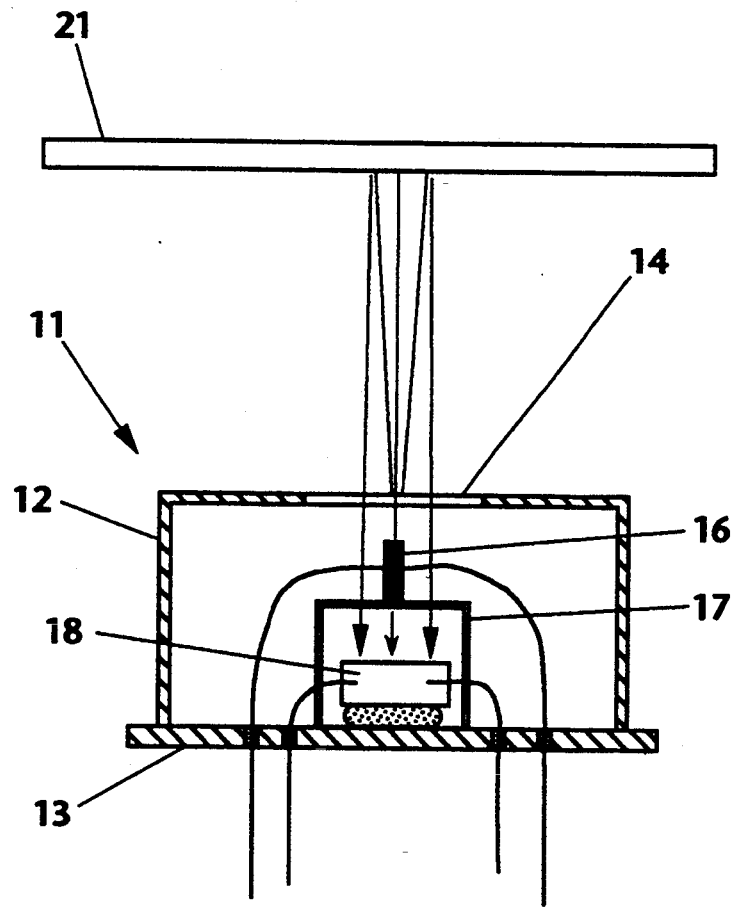
Figure_3
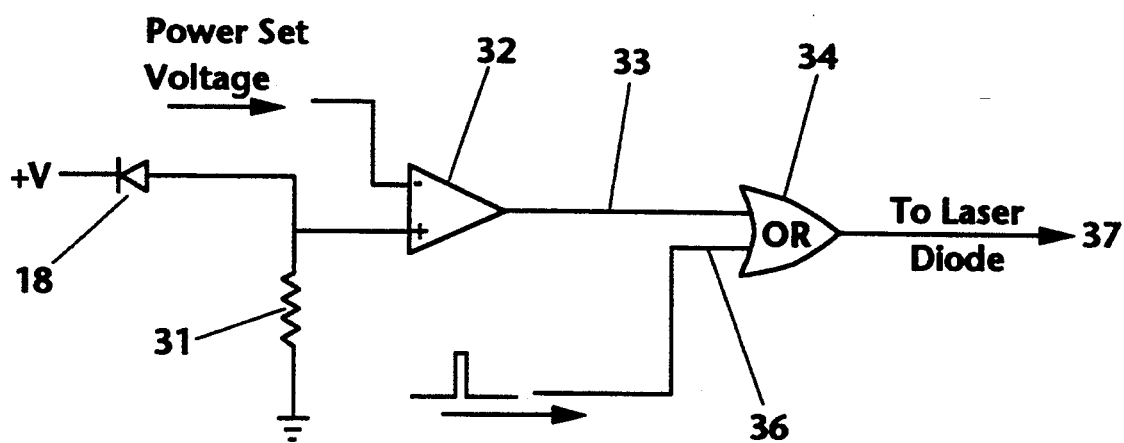
Figure_4

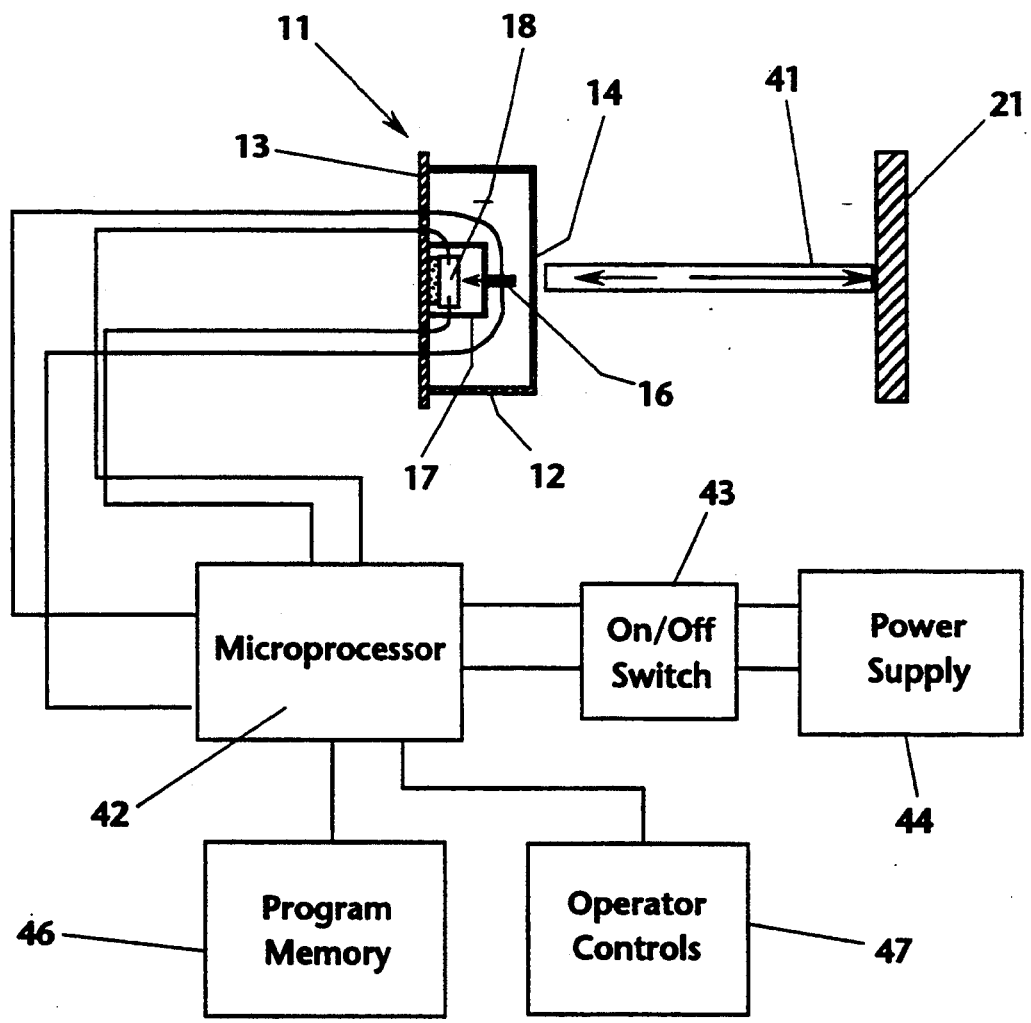
Figure_5
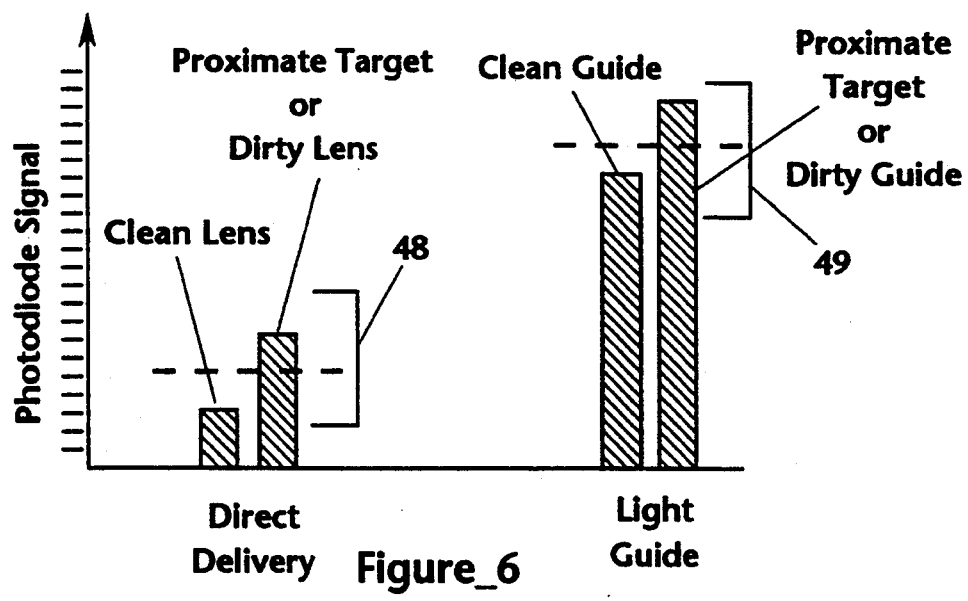
Figure_6

LASER BEAM DELIVERY PATH AND TARGET PROXIMITY SENSOR

REFERENCE TO RELATED PATENT APPLICATION

This application is a continuation-in-part of application Ser. No. 07/877,746, filed May 4, 1992, now U.S. Pat. No. 5,262,636, issued Nov. 16, 1993.

BACKGROUND OF THE INVENTION

In the manufacturing and packaging of laser diodes, it is a common practice to place the laser diode in a standard electronic device housing such as a TO housing, and to include a photodiode or other photosensor within the housing. The laser diode device generally includes parallel mirror surfaces that define the resonant cavity of the laser, with one of the mirror surfaces totally reflective and the other, partially reflective mirror surface comprising the output of the laser diode. Although the one mirror surface is generally considered to be completely reflective, a small amount of the laser light is transmitted therethrough. The photodiode is placed adjacent to the totally reflective mirror surface to receive the light leaking through the mirror surface. The current through the photodiode is proportional to the output of the laser diode. The photodiode may be connected to an external circuit that controls the laser diode output, so that a feedback loop is established that very accurately controls the power output of the laser diode.

As development of laser diode devices has advanced in recent years, the maximum power output has increased markedly. Laser diodes are now sufficiently powerful to be used for medical treatment, such as, but not limited to, ophthalmic procedures, dental procedures, and irradiation of tissue for purposes of wound healing, pain relief, and anesthesia. A potential problem concomitant with the use of more powerful laser diode devices is that the beam projected by a device may pose a safety hazard, especially regarding the eyes of personnel in the general vicinity of laser use. This problem is compounded by the fact that most high power laser diodes currently available operate in the infrared band, and are not visible to the human eye. Therefor, it is essential that the laser diode device be directed toward an intended target, and be prevented from emitting a free beam that can cause harm at large distances.

Moreover, it is beneficial to know that the delivery path of the laser device is free of dirt, oil and other debris that can scatter the laser output and diminish the effectiveness of the laser treatment. If the laser device operates in the visible spectrum, the scattering effect is easily visualized. However, an invisible laser beam may be scattered or attenuated by dirt and the like without being observed, and the effectiveness of the laser treatment may suffer without apparent cause. Thus, a system for warning of laser beam scattering or attenuation in the delivery path would be very useful for infrared laser devices.

It is an object of the invention to provide a proximity device to enable laser diode operation. It is a further object to utilize the photodiode generally included in the laser diode housing to form a proximity sensor. More specifically, an object of the invention is to detect whether or not an object is proximate to the output window of the laser diode, and to permit operation of the laser diode only when an object is sufficiently proximate to receive the laser output beam in point blank fashion. A further object of the invention is to use the photodiode in the laser diode housing to detect the scattering, blocking, or attenuation of the laser output, and warn the user of these conditions so that the delivery path may be cleared or cleaned when required.

SUMMARY OF THE PRESENT INVENTION

The present invention generally comprises a proximity sensor apparatus for use with a laser diode device to permit operation of the laser diode only when an object is sufficiently proximate to receive the laser output beam in point blank fashion. The apparatus utilizes the photodiode or similar device generally included in the housing of the laser diode, and includes an electronic circuit coupled to the photodiode to monitor the output of the photodiode. When an object is closely adjacent to the output window of the laser diode, reflected light from the laser diode is transmitted retrograde through the output window and is received by the photodiode within the housing. By establishing a threshold level for the photodiode current, the circuit of the invention determines the proximity of the reflecting object and permits (or prevents) operation of the laser diode.

The circuit also includes a sampling timer to operate the laser diode for a very brief period (on the order of microseconds) each second, to ascertain if a target object is proximate to the laser diode output. The circuit is set to prevent laser operation, and operates the laser diode to emit a brief test pulse and determine the level of reflected laser light. If the reflected light level indicates that a target object is proximate, the circuit will switch on the laser diode, while continuing to monitor the photodiode current. If the reflected light level indicates that no target object is proximate, the laser diode will remain off, and the circuit will emit another brief test pulse after a delay of approximately one second. This process will reiterate.

The invention further includes the use of a photodiode associated with a laser diode for detecting dirt, oil, or similar debris in the laser beam delivery path that causes scattering or attenuation of the laser beam. An electronic circuit or microprocessor is configured to operate the laser diode to emit a brief sampling pulse whenever the laser system is turned on, prior to operating the laser diode in a treatment mode. The circuit or microprocessor detects the signal level from the photodiode and compares it with a nominal signal level range indicative of a clear delivery path. If the delivery path is obscured by dirt or the like that reflects laser light retrograde to the photodiode, the photodiode signal level will fall outside the nominal range for the delivery path configuration, and the system will warn the user to clear or clean the delivery path.

The delivery path may be defined as the output window of the laser diode, particularly when the target is impinged directly on the output window. Alternatively, the output window may comprise a light guide formed by a rod or tube of material that is transparent to the laser wavelength. For example, a transparent plastic or glass rod may be coupled to the output window of the laser diode to conduct the laser beam to a more distant target. In any case, the nominal range for the photodiode signal may be determined a priori, and the system may discern the configuration of the delivery path and the nominal value range of the photodiode signal as well as whether the signal is within the nominal range.

BRIEF DESCRIPTION OF THE DRAWING

FIG. 1 is a cross-sectional elevation of a typical prior art laser diode device.

FIG. 2 is a plan view of a typical prior art laser diode device.

FIG. 3 is a cross-sectional view of a laser diode device used in accordance with the present invention.

FIG. 4 is a schematic representation of the electronic circuit portion of the present invention.

FIG. 5 is a schematic representation of a further embodiment of the invention used to detect an obscured laser delivery path and to detect a target proximate to the output of the laser delivery path.

FIG. 6 is a graphical depiction of the photodiode signal level for differing beam delivery path configurations and clear versus occluded delivery paths.

DESCRIPTION OF THE PREFERRED EMBODIMENT

The present invention generally comprises a proximity sensor apparatus for use with a laser diode device to permit operation of the laser diode only when an object is sufficiently proximate to receive the laser output beam in point blank fashion. As shown in FIGS. 1 and 2, a laser diode device 11 known in the prior art generally comprises a cylindrical housing 12 sealed to a base plate 13. The housing 12 and base plate 13 define an enclosed space in which a laser diode device 16 is mounted on a support and heat sink 17. A window 14 disposed in the end wall of the cylindrical housing is provided to transmit the laser beam from the device 16.

The laser diode 16 generally includes a pair of spaced apart mirror surfaces which define the resonant cavity of the laser. The rear mirror is almost 100% reflective, so that generally all of the laser output is directed outward from the other, partially reflective mirror of the laser cavity. However, a small amount (<1%) of the laser energy does leak through the totally reflective mirror. A photodiode 18 or similar photosensor is disposed adjacent to the rear mirror to receive laser light from the rear mirror surface. The photodiode 18 may be electrically connected to a circuit which monitors the current through the photodiode. Due to the fact that the light transmitted through the rear mirror is proportional to the laser output through the front surface, the current through the photodiode 18 may be used to determine the laser output power. By connecting the photodiode to an appropriately designed external circuit which controls the current through the laser diode 16, the power output of the laser diode may be controlled very accurately.

The present invention makes use of the existing photodiode that is provided in a typical prior art laser diode assembly to provide a proximity detector function that controls the operation of the laser diode. As shown in FIG. 3, a reflective target object 21 that is placed in closely adjacent relationship to the window 14 will reflect a substantial portion of the laser output in retrograde fashion through the window 14 to impinge on the photodiode 18. The photodiode signal thus will represent a combination of the light from the rear surface of the laser diode device and the reflected light. However, due to the fact that the reflected light is much more powerful than the leakage light, the photodiode signal will change perceptibly when the target 21 is brought within a predetermined distance.

With regard to FIG. 4, the photodiode 18 is connected to a positive voltage source so that it will pass a current which is a known function of the laser output if none of the laser light is reflected back to the diode 18. The laser diode 16 produces laser light which is a known function of the current passing through the laser diode; therefor, the photodiode 18 current is a function of the current driven through the laser diode. The relationship of the photodiode current and the laser diode current can be approximated by a linear function. If the photodiode current is significantly higher than what would be expected for a known laser power, then it could be assumed that laser light is being reflected back into the laser diode housing by a target object 21 in close proximity to the output window of the laser diode device.

The photodiode 18 is connected to a resistor 31, which in turn is connected to ground. The voltage drop across the resistor 31 is proportional to the photodiode current; by proper choice of the resistor value, the voltage across the resistor may be scaled appropriately. (A potentiometer may be substituted for the resistor 31 to provide variable sensitivity, permitting selection of the threshold distance at which the reflecting object actuates the laser.) A comparator 32 has one input connected to the voltage across resistor 31, and the other input is connected to the voltage signal that drives the laser diode. If the voltage developed across the resistor 31 is higher than the voltage determining the laser power, then the comparator 32 switches high and allows the laser to continue operating. However, if the voltage developed across the resistor 31 is less than the voltage determining the laser power, then the comparator 32 switches low and prevents continued operation of the laser. It should be noted that a higher laser diode output power will cause a greater current in the photodiode 18, due to increased light transmission through the rear surface of the laser diode, as pointed out above. The comparison of the photodiode output with the laser diode input assures that only light reflected back into the laser diode housing will trigger the device.

The circuit also includes a sampling timer feature to determine if a target is proximate to the laser diode output window. The output 33 of the comparator 32 is connected to one input of an OR gate 34, and another input 36 of the OR gate is connected to a sampling clock pulse source. The sampling clock pulse source, which may comprise any form of timer circuit known in the prior art, is set to generate a brief pulse periodically and reiteratively. For example, the clock pulse may comprise a pulse of a few microseconds at a rate of one Hertz. The output 37 of the OR gate 34 is connected to an enable circuit that drives the laser diode, so that either the sampling pulse or the comparator output will cause the laser diode to operate. Thus the laser diode will operate at least once each second for an extremely brief period that is sufficient to determine if reflected laser light is received by the photodiode. If there is no reflection detected, the laser diode will be switched off by the lack of an output from the OR gate 34. If a reflection of the laser light occurs, the comparator output 33 will go high, the OR gate 34 output will remain high, and the laser diode will continue to operate.

The sampling pulse width may be adjusted so that the laser output during the sampling pulse does not comprise a safety hazard. For example, using a 100 milliwatt laser diode pulsed for 100 microseconds at one Hertz, the average power output is 10 microwatts, far below the threshold for eye damage, In contrast, 100 milliwatts of continuous laser energy can cause severe eye damage.

It should be noted that the circuit of the invention will turn off the laser diode immediately when the reflecting object is moved beyond a threshold distance at which the reflected light intensity no longer causes the comparator to generate an output.

With regard to FIG. 5, a further embodiment of the invention employs a laser diode assembly as described previously, and the same reference numerals are used to identify the same components. The output of the diode laser 16 is directed through the output window 14 to a target 21. A light guide 41 such as a transparent glass or plastic rod may be interposed removably between the window 41 and the target 21 to direct the laser beam to a desired spot on the target. The light guide 41 may be linear or curved, and may be used for laser treatment in dentistry, laser acupuncture, pain relief, wound healing, and the like.

A microprocessor 42 is connected through an on/off switch 43 to a low voltage DC power supply 44. The microprocessor may comprise any one of many that are currently available that feature both analog and digital inputs, and analog and digital outputs. The laser diode 16 may be connected to analog current outputs of the microprocessor, and the photodiode 18 may be connected to analog voltage inputs of the microprocessor. The microprocessor 42 may include RAM and ROM memory portions of the integrated circuit, and additional program memory 46 may be required.

The microprocessor is provided with an operating program that permits operation of the laser diode 16 upon activation of an operator control 47, which permits the operator to set the laser power level and duration of laser output, and to start the laser output. The ROM is loaded with a look-up table that correlates laser output power with input current required to achieve a desired output. The ROM is also loaded with values representing nominal value ranges for the photodiode output signal for each delivery path configuration (either direct from the window 14 or through the light guide 41), and further breaks down each range by storing a threshold value that distinguishes whether the delivery path is clear or at least partially occluded by dirt, dust, body oil or other excretions, or the like.

The program that directs the microprocessor 42 operates so that upon power-up of the system by turning on switch 43, the laser diode emits a brief sampling pulse at a predetermined power level, and the resulting photodiode signal is detected by the microprocessor and compared with values in the ROM look-up table. The comparison determines the nominal value range 48 or 49 for the photodiode signal, and further determines whether the photodiode signal is above or below the clear delivery path threshold stored in ROM. For example, if the delivery path is occluded by dirt or the like, laser light reflected from the dirt will cause the photodiode signal level to exceed the threshold for the nominal range. In this case the microprocessor will cause a display of a message to the laser user directing that the beam delivery path be cleared, as by cleaning the window 14 or cleaning the output end of the light guide 41. Thus the beam delivery path is checked and cleared, if necessary, prior to treatment operation of the laser device.

During operation of the laser device under direction of the operator controls 47, the microprocessor receives the power setting of the controls 47 and provides the appropriate current to the laser diode 14 to generate the desired power output. At the same time, the photodiode signal is monitored by the microprocessor 42 to determine if the photodiode signal is above or below a threshold (broken line in each nominal range 48 or 49), which is indicative of reflection of the laser beam from a target object. If the photodiode signal exceeds the threshold level (stored in ROM), the target must be proximate to the output of the delivery path, and the operation of the laser diode is continued until the treatment duration setting is satisfied. If the photodiode signal fails to exceed the threshold value, indicating that no target is proximate to the output of the delivery path, the laser output is interrupted. Thereafter, a sampling pulse is emitted reiteratively, and the photodiode signal is compared to the threshold level; if the signal exceeds the threshold level, operation of the laser diode is continued at the desired power level.

Thus the embodiment of FIG. 5 both assures that the laser beam delivery path is unimpeded, and that a target is close to the output of the delivery path. It may be appreciated that laser light reflection from dirt, dust, or the like in the delivery path could result in a false indication a target proximate to the output of the delivery path. Thus assurance of a clear delivery path for the laser beam also prevents false indication of a target proximate to the output of the delivery path, and the invention provides a functional synergy.

I claim:

1. An operating system for a laser diode device, including;
   a laser diode for emitting a laser beam along a beam delivery path;
   photosensor means disposed proximate to said laser diode to receive laser diode light reflected retrograde in said beam delivery path and generate a photodiode signal;
   sampling pulse means for driving said laser diode to emit a brief sampling pulse upon power-up of said operating system;
   means for comparing said photodiode signal during said brief sampling pulse to a predetermined beam path threshold level; and,
   means for warning of an occluded beam delivery path if said photodiode signal exceeds said predetermined beam path threshold level.

2. The operating system of claim 1, further including means for comparing said photodiode signal during said brief sampling pulse to a plurality of nominal value ranges, each range corresponding to a differing beam delivery path configuration.

3. The operating system of claim 2, further including a plurality of predetermined beam path threshold levels, each of said predetermined beam path threshold levels associated with one of said nominal value ranges, and means for selecting a beam path threshold level associated with a nominal value range of said photodiode signal.

4. The operating system of claim 1, further including operating control means for actuating said laser diode for treatment purposes, and means for comparing said photodiode signal to a predetermined target threshold level during actuation of said laser diode for treatment purposes to determine if a target is proximate to the output of said beam delivery path.

5. The operating system of claim 4, further including means for interrupting operation of said laser diode if said photodiode signal fails to exceed said target threshold level.

6. The operating system of claim 5, further including means for reiteratively actuating said laser diode to emit brief sampling pulses when operation of said laser diode is interrupted, and means for comparing said photodiode signal to said target threshold level during said brief sampling pulses.

7. A method for operating a laser system employing a laser diode device having a monitor photodiode, including the steps of:
  actuating said laser diode to emit a brief sampling pulse upon power-up of said laser system and prior to operator use of said laser system to check the beam delivery path of said laser diode;
  comparing the output signal of said monitor photodiode to a beam path threshold level; and
  blocking further operation of said laser diode when said output signal of said monitor photodiode exceeds said beam path threshold level, indicative of at least partial occlusion in said beam delivery path of said laser diode.

8. A method for operating a laser system employing a laser diode device having a monitor photodiode, including the steps of:
  actuating said laser diode to emit a brief sampling pule upon power-up of said laser system and prior to operator use of said laser system;
  comparing the output signal of said monitor photodiode to a first threshold level;
  blocking further operation of said laser system when said output signal of said monitor photodiode exceeds said first threshold level, indicative of at least partial occlusion in the beam delivery path of said laser diode;
  comparing said output signal of said monitor photodiode to a second threshold level during operator use of said laser system to determine if a target is proximate to the output of the laser beam delivery path; and
  interrupting operation of said laser diode when said output signal of said monitor photodiode fails to exceed said second threshold level.

9. The method of claim 8, further including the step of operating said laser diode to emit brief sampling pulses after interruption of operation of said laser diode, and resuming continuous operator use of said laser diode when said output signal of said monitor photodiode exceeds said second threshold level during any of said brief sampling pulses.

* * * * *